(12) United States Patent
Inspektor

(10) Patent No.: US 6,593,015 B1
(45) Date of Patent: Jul. 15, 2003

(54) TOOL WITH A HARD COATING CONTAINING AN ALUMINUM-NITROGEN COMPOUND AND A BORON-NITROGEN COMPOUND AND METHOD OF MAKING THE SAME

(75) Inventor: Aharon Inspektor, Pittsburgh, PA (US)

(73) Assignee: Kennametal PC Inc., Monrovia, CA (US)

( * ) Notice: Subject to any disclaimer, the term of this patent is extended or adjusted under 35 U.S.C. 154(b) by 0 days.

(21) Appl. No.: 09/442,599

(22) Filed: Nov. 18, 1999

(51) Int. Cl.$^7$ ................................................. B32B 9/00

(52) U.S. Cl. ...................... 428/698; 428/216; 428/472; 428/704

(58) Field of Search ................................ 428/698, 472, 428/469, 704, 216

(56) References Cited

U.S. PATENT DOCUMENTS

| | | | |
|---|---|---|---|
| 4,035,541 A | 7/1977 | Smith et al. ................ | 428/217 |
| 4,237,184 A | 12/1980 | Gonseth et al. ............ | 428/336 |
| 4,282,289 A | 8/1981 | Kullander et al. .......... | 428/457 |
| 4,399,168 A | 8/1983 | Kullander et al. ........ | 427/255.7 |
| 4,599,281 A | 7/1986 | Schinlmeister et al. .... | 428/699 |
| 4,619,865 A | 10/1986 | Keem et al. ................ | 428/333 |
| 4,643,951 A | 2/1987 | Keem et al. ................ | 428/469 |
| 4,717,632 A | 1/1988 | Keem et al. ................ | 428/698 |
| 4,724,169 A | 2/1988 | Keem et al. ................ | 427/249 |
| 4,731,303 A | 3/1988 | Hirano et al. .............. | 428/700 |
| 4,762,729 A | 8/1988 | Hirano et al. .............. | 427/38 |
| 4,892,791 A | 1/1990 | Watanabe et al. .......... | 428/698 |
| 4,919,773 A | 4/1990 | Naik ........................ | 204/38.4 |
| 4,965,140 A | * 10/1990 | Sarin ........................ | 428/699 |
| 5,002,798 A | 3/1991 | Donley et al. ............. | 427/53.1 |
| 5,053,245 A | 10/1991 | Kiyama et al. ............ | 427/38 |
| 5,096,740 A | 3/1992 | Nakagama et al. ....... | 427/53.1 |
| 5,137,772 A | 8/1992 | Watanabe et al. .......... | 428/212 |
| 5,249,554 A | 10/1993 | Tamor et al. .............. | 123/90.51 |
| 5,266,388 A | 11/1993 | Santhanam et al. ........ | 428/212 |

(List continued on next page.)

FOREIGN PATENT DOCUMENTS

| | | |
|---|---|---|
| EP | 0476825 | 10/1995 |
| EP | 0709483 | 5/1996 |
| JP | 5930769 | 8/1982 |
| JP | 6243273 | 12/1985 |
| JP | 6326349 | 2/1988 |
| JP | 0225562 | 7/1988 |
| JP | 3260054 | 11/1991 |
| JP | 4124272 | 4/1992 |
| JP | 4168263 | 4/1992 |
| JP | 4337064 | 11/1992 |
| JP | 5286789 | 11/1993 |
| JP | 7-18415 | 1/1995 |

OTHER PUBLICATIONS

International Search Report in PCT Patent Application No. PCT/US00/30207 (Mailed Mar. 15, 2001).

Devries, Cubic Boron Nitride: Handbook of Properties, General Electric Report 72CRD178 (Jun. 1972), pp. 2–17.

Franchi, et al., New Generation PVD "PLATIT" Coatings for Cutting Tools, Punches, and Dies. Fourth Euro Ceramics vol. 9, pp. 396–406.

(List continued on next page.)

Primary Examiner—Archene Turner
(74) Attorney, Agent, or Firm—John J. Prizzi

(57) ABSTRACT

A tool which includes a substrate which has a first surface and a second surface wherein the first surface ad the second surface intersect to form an edge. A adhesion coating scheme is on the substrate. The adhesion coating scheme comprises an innermost layer which contains titanium, and is on the surface of the substrate. The adhesion coating scheme includes an outermost adhesion layer. A wear coating scheme is on the adhesion coating scheme. The wear coating scheme includes one or more wear coating sequences wherein each wear coating sequence comprises an inner layer including aluminum and nitrogen and an outer layer including boron and nitrogen.

24 Claims, 3 Drawing Sheets

U.S. PATENT DOCUMENTS

| | | | |
|---|---|---|---|
| 5,330,611 A | | 7/1994 | Doll .......................... 117/105 |
| 5,398,639 A | | 3/1995 | Doll et al. ...................... 117/4 |
| 5,409,622 A | | 4/1995 | Chapman et al. ............. 252/25 |
| 5,503,913 A | * | 4/1996 | Konig et al. ................ 428/216 |
| 5,545,249 A | | 8/1996 | Tanaka et al. ................ 75/246 |
| 5,618,509 A | | 4/1997 | Shioi et al. ................. 423/290 |
| 5,633,214 A | | 5/1997 | Nishio et al. .............. 501/96.4 |
| 5,639,551 A | | 6/1997 | Ong et al. ................... 428/408 |
| 5,643,842 A | | 7/1997 | Unno et al. ................... 501/88 |
| 5,670,252 A | | 9/1997 | Makowiecki et al. ....... 428/336 |
| 5,691,260 A | | 11/1997 | Suzuki et al. ................ 501/96 |
| 5,723,188 A | * | 3/1998 | Luthje et al. ............... 427/577 |
| 5,725,913 A | | 3/1998 | Wong et al. ................ 427/530 |
| 5,882,777 A | * | 3/1999 | Kukino et al. .............. 428/698 |
| 5,882,778 A | | 3/1999 | Sugizaki et al. ............ 428/216 |
| 5,948,541 A | | 9/1999 | Inspektor .................... 428/469 |
| 5,976,716 A | | 11/1999 | Inspektor .................... 428/698 |
| 6,054,185 A | | 4/2000 | Inspektor ................. 427/419.7 |
| 6,117,533 A | | 9/2000 | Inspektor .................... 428/216 |
| 6,213,692 B1 | * | 4/2001 | Guehring et al. ........... 408/144 |

OTHER PUBLICATIONS

Kessler et al., Laser Pulse vapour deposition of polycrystalline wurtzire–type BN, Thin Solid Films, 147 (1987), L–45–L50.

Brochure, Guhring 222 vol. 16, Coated Tools for Small Batches, [20 pages] (1996).

Rechberger et al., High performance cutting tools with a solid lubricant physically–vapor deposited coated, Surface and Coatings Tech., 62 (1993), pp. 393–398.

Program and Abstracts, Int. Conf. On Met. Coatings and Thin Films, San Diego, CA (1997).

Richter et al., Utilization of the Cathodic Arc Evaporation for the Deposition of Boron Nitride Thin Films, Poster BN.07, presented at ICMCTF–96, pp. 1–10.

Tsuda et al., Mass and Energy Measurements of the species responsible for cBN growth in rf sputter conditions, J. Vac. Sci Tech. A 15(6) (1997) pp. 2859–2863.

Park et al., Observation of a hexagonal BN surface layer on the cubic BN film growth by dual ion beam sputter deposition, pp. 1–12 (1996) [accepted by Applied Phys. Letter].

Park et al., Growth mechanism of cubic boron nitride thin films by ion beam assist sputter deposition, J. Vac. Sci. Tech. A15(3) (1997), pp. 1041–1047.

Ilias et al., Microstructure of cBN Films Deposited by IBAD: IR and HREM analyses, 6 pages [accepted by Nat. Res. Soc. Symp. Proc. (1997)].

Bozzolo et al. texture Investigations by ATEM of IBAD Deposited c–BN Films, 9 pages [submitted to Applied Physics Letters] (date unknown).

Widmayer et al., Electron Energy Loss Spectroscopy– An Additional Tool to Characterize Thin Films of Cubic Boron Nitride, [15 pages] accepted for publication by Diamond and Related Materials.

Barth et al., Deposition of cubic boron nitride layers–characterization of substrate–layer interface, Thin Solid Films, 301 (1997), pp. 65–70.

Loeffler et al., PACVD nano–crlsstalline BCN thin films obtained by use of an organoboron precursor, Diamond and Related Materials 6 (1997), pp. 608–611.

Plass et al., Layered structure diagnostic and optical modeling of c–BN films, Nuclear Instruments & Methods in Physics Research, B127/128 (1997), pp. 857–860.

Plass et al., Growth and characterization of boron nitride films: layer sequence and phase identification, Diamond and Related Materials 6 (1997), pp. 594–598.

Plass et al., Layered growth of boron nitride thin films, Thin Solid Films 305 (1997), pp. 172–184.

Konyashin et al., Plasma–assisted CVD of Cubic Boron Nitride, Chem Vap Deposition 1997, 3 No. 5.

Ilias et al., Microstructure and Stress Investigations of Cubic Boron Nitride Thin Films, Diamond and Related Materials (1997).

Zhao et al., Physical properties of dual beam depositedB0.5–xSix)No. 5 Films, J. Vac. Sci. Technol. A 15(4) Jul./Aug. 1997 pp 2297–2306.

Xin et al., Phase evolution in boron nitride thin films prepared by a dc–gas discharge assisted pulsed laser deposition, Thin Solid Films 293 (1997) pp. 17–21.

Berns et al., Near–edge X–ray absorption fine structure spectroscopy of arcjet–deposited cubic boron nitride, Diamond and Related Materials 6 (1997) pp. 1883–1886.

Setsuhara et al., Interfacial structure control of cubic boron nitride films prepared by ion–beam assisted deposition, Nuclear Instr and Meth. In Phys Research B 127/128 (1997) pp. 851–856.

Hofsass et al., Thresholds for the phase formation of cubic boron nitride thin films, Physical Review B, vol. 55, No. 19 (1997) pp. 230–233.

Edgar et al., c–Boron–aluminum nitride alloys prepared by ion–beam assisted deposition, Thin solid Films 298 (1997) 33–38.

Gimeno et al., Cubic boron nitride thin films by tuned rf magnetron sputtering, Diamond and Related Materials 6 (1997) 604–607.

Yoshida, State of the Art Vapor Phase Deposition of Cubic Boron Nitride, Diamond Films and Tech, vol. 7 No. 2 (1997) pp. 87–104.

Gafri et al., Boron Nitride Coating on Steel and Graphite Produced with a Low Pressure RF Plasma, Thin Solid Films, 72 (1980) pp. 523–527.

Rechberger et al., High Performance cutting tools with a solid lubricant physically vapor deposited coating, Surface and Coatings Tech. 62 (1993) pp. 393–398.

Kuhr et al., Deposition of cubic boron nitride with a inductively coupled plasma, Surface and Coatings Tech. 74–75 (1995) pp. 806–812.

Ikeda et al., Formation of cubic boron nitride films by arc–like plasma enhanced ion plating method, J. Vac. Sci. Techol. A8(4) Jul./Aug. 1990.

Montasser et al., A Promising Boron–Carbon Nitrogen Thin Film, Materials Science For, vol. 54 & 55 (1990) pp. 295–312.

Karnezos, Boron–Nitrogen–Hydrogen Thin Films, Materials Science Forum vols. 54 &55 (1990) pp. 261–276.

Ikeda et al., Formation and characteristics of cubic boron nitride films by an arc–like plasma–enhanced ion plating method, Surface and Coatings Tech. 50 (1991) pp. 33–39.

Herr et al., Fundamental properties and wear resistance of rf sputtered TiB2 and Ti(B,N) coatings, Materials Science and Engineering A140 (1991) pp. 616–624.

Aromaa, et al., A comparative study of the corrosion performance of TiN, Ti(B,N) and (Ti,Al)N coatings produced by physical vapor deposition methods, Materials Science and Engineering A140 (1991) pp. 722–726.

Doll et al., Growth and characterization of epitaxial cubic boron nitride films on silicon, Physical Review 43 (1991) pp. 6816–6819.

Edgar, Prospects for device implementation of wide band gap semiconductors, J. Mater. Rse. vol. 7 No. 1 (1992) pp. 235–252.

Ikeda, Cubic boron nitride films synthesized by low–energy ion–beam enhanced vapor deposition, Appl Phys. Lett 61(7) (1992) p. 786–788.

Kester et al., Phase control of cubic boron nitride thin films, J. Appl. Phys. 72(2) (1992) pp. 504–513.

Mieno et al., Preparation of Cubic Boron Nitride Films by Rf Sputtering, J. Appl. Phys. 29(7) (1990) pp. L1175–L1177.

Murakawa et al., Characteristics of C–BN Film Made by a Reactive Ion Plating Method, pp. 1099–1104.

Wada et al., Formation of cBN Films by ion beam assisted deposition, J. Vac. Sci. Technol. A vol. 10 No. 3 (1992) pp. 515–520.

Stovicek, Hard–part turning, Tool & production ( Feb. 1992).

Noaker, Hard Facts on Turning, Manufacturing Engineering Feb. 1992.

Matthes et al., Tribological properties and wear behavior of sputtered titanium–based coatings under sheet–metal forming conditions, Materials Science and engineering A140 (1991) 593–601.

Sueda et al., Fundamental research on the deposition of cubic boron nitride films on curved substrates by ion–beam assisted vapor deposition, Thin Solid Films 228 (1993) 97–99.

Brookes, Tools on the cutting edge, American Machinist Dec. 1993 pp. 30–32.

Stoviek, Turning to hard part turning, Tool & Production Magazine (Jan. 1993).

Gissler, Preparation and Characterization of Cubic Boron Nitride and Metal Boron Nitride Films, Surface and Interface Analysis vol. 22 pp. 139–148 (1994).

Ong et al., Deposition of Cubic BN on Diamond Interlayers, NASA Tech Brief vol. 18 No. 8 Item 74.

Riefel, Novel Ultrahard Materials, Adv. Mater. (1994) 6, No. 7/8 pp. 549–560.

Zhang et al., Deposition of high quality cubic boron nitride films on nickel substrates, Appl. Phys Lett 65(8) Aug. 1994 pp. 971–973.

Kroczynski et al., Ion Beam–Assisted Deposition of Boron Nitride from a Condensed Layer of Diborane and Ammonia at 78 K, Mat Res Soc Sympos Proc vol. 316 (1994) pp. 869–873.

Ichiki et al., Growth of Cubic Boron Nitride Films by Low–Pressure Inductively Coupled Plasma Enhanced Chemical Vapor Deposition, Jpn. J. appl. Phys 33 (1993) pp. 4385–4388.

Inspektor et al., Superhard coatings for metal cutting applications, Surface and Coatings Tech 68/69 (1994) pp. 359–368.

Song et al., Textured growth of cubic boron nitride film on nickel substrates, Appl. Phys Lett 65(21) (1994) pp. 2669–2671.

Vasilash, The Superhard Coatings: More than Meets the Eye, Production (Dec. 1995) pp. 52–54.

Kuhr et al., Deposition of cubic boron nitride with an inductively coupled plasma, Surface and Coatings Tech. 74–75 (1995) pp. 806–812.

Noaker, Hard turning heats up, Manufacturing Engineering Jun. 1995 pp. 47–50.

Sprow, Diamond Coatings: Ready to Rip?, Manufacturing Engineering Feb. 1995 pp. 41–46.

Cook, PCBNs cut into marketplace, Canadian Machinery and Metalworking, pp. 13–14.

Murakawa et al., The Synthesis of Cubic BN Films using a Hot Cathode Plasma Discharge in a Parallel Magnetic Field, (1990) pp. 128–136.

Vilab Literature on Movic (date unknown).

Ceme Con Literature on CS–800 Coating Systems (date unknown).

Ceme Con Literature on HIS Process Module (date unknown).

Ikeda et al., Formation and characterization of cubic boron nitride films by an arc–like plasma enhanced ion plating method, Surface and Coatings tech. 50 (1991) pp. 33–39.

Kester et al., Phase control of cubic boron nitride films, J. Appl. Phys. 72(2) Jul. 1992 pp. 504–514.

Nishiyama et al., The synthesis and properties of BN films prepared by ion irradiation and vapor deposition, Nuclear Instr. and Methods in Phys Res. B80/81 (1993) pp. 1485–1488.

Mitterer et al., Sputter Deposition of Ultrahard Coatings within the System Ti–B–C–N, Surface and Coatings Technol. 41 (1990) pp. 351–363.

Inagawa et al., Structure and properties of c–BN films deposited by an activated reactive evaporation with a gas activation nozzle, Surface and Coatings technol. 39/40 (1989) pp. 253–264.

Arya et al., Preparation and Properties and Applications of Boron Nitride Thin Films, Thin Solid Films 157 (1988) pp. 267–282.

Andoh et al., On the Formation of BN Films by Ion Beam and Vapor Deposition, Nuclear Instr. And Methods of Research B33 (1988) pp. 678–680.

Goranchev et al., Compressive stress of thin cubic BN films prepared by rf sputtering on rf–biased substrates, Thin Solid Films 149 (1987) L–77–L80.

Satou et al., Formation of Cubic Boron Nitride Films by Boron Evaporation and Nitrogen Ion Beam Bombardment, Japanese Journal of Applied Physics 22(3) (1983) pp. L171–L172.

Peytavy et al., Chemical vapor deposition of titanium boron nitride, High Temperature–High Pressure (1978) vol. 10 pp. 341–345.

cBN Consortium Penn State Status and Work Statement for 1998.

Messier, cBNC Program and Directions, Penn State (1997).

Yarbrough, Thermodynamics of c–BN?, DRMC Meeting (Oct. 10, 1994) Penn State.

Collins et al., Real Time Spectroscopic Ellipsometry for cBN Nucleation and Growth Analysis, $4^{th}$ cBNC Meeting (Dec. 8–9, 1997) Penn State.

Pilione et al., AIN–BN Deposition, $4^{th}$ cBNC Meeting (Dec. 8–9, 1997) Penn State.

* cited by examiner

TOOL WITH A HARD COATING CONTAINING AN ALUMINUM-NITROGEN COMPOUND AND A BORON-NITROGEN COMPOUND AND METHOD OF MAKING THE SAME

FIELD OF THE INVENTION

The invention pertains to tools with a hard coating. More specifically, the invention pertains to tools (e.g., round tools and cutting inserts) with a hard coating which includes a compound containing aluminum and nitrogen and a compound containing boron and nitrogen.

BACKGROUND OF THE INVENTION

As materials technology advances many new materials, including new hard materials, become commercially useful. Such new hard materials include without limitation sintered ultra-fine powdered metals, metal-matrix composites, heat treated hardened steels (hardnesses of between 50 to 65 Rockwell C), and high temperature alloys. These new materials have extraordinary combinations of properties, such as, for example, hardness, toughness and wear resistance, that make them very suitable for uses in heavy industries, aerospace, transportation, and consumer products.

For these new hard materials to realize their optimum commercial potential, one must overcome the challenges these materials present to existing manufacturing and finishing processes. One of the reasons these challenges exist is that these materials are very difficult and expensive to drill, cut, form, and otherwise perform work on as workpiece materials. One can best address these challenges by the use of strong tools such as, for example, round tools (which include without limitation drills, end mills, reamers), as well as cutting inserts, that use a hard coating. This invention pertains to just such strong tools with a hard coating.

SUMMARY OF THE INVENTION

In one form thereof, the invention is a tool comprising a substrate which has a first surface and a second surface wherein the first surface and the second surface intersect to form an edge. There is an adhesion coating scheme on the substrate wherein the adhesion coating scheme comprises an innermost layer including titanium on the surface of the substrate and an outermost adhesion layer. There is a wear coating scheme on the adhesion coating scheme wherein the wear coating scheme includes one or more wear coating sequences wherein each wear coating sequence comprises an inner layer including aluminum and nitrogen and an outer layer including boron and nitrogen.

In another form thereof, the invention is a tool comprising a substrate which has a first surface and a second surface wherein the first surface and the second surface intersect to form an edge. There is an innermost layer containing titanium on the surface of the substrate. There is a wear coating scheme on the innermost layer wherein the wear coating scheme includes one or more wear coating sequences. Each wear coating sequence comprises an inner layer including aluminum and nitrogen and an outer layer including boron and nitrogen wherein the outer layer is on the inner layer.

In still another form, the invention is a process of making a coated tool comprising the steps of: providing a substrate; applying an adhesion coating scheme to the substrate wherein the adhesion coating scheme comprising an innermost layer containing titanium being on the surface of the substrate and an outermost adhesion layer; and applying a wear coating scheme on the adhesion coating scheme wherein the wear coating scheme including one or more wear coating sequences wherein each wear coating sequence comprises an inner layer including aluminum and nitrogen and an outer layer including boron and nitrogen.

In another form thereof, the invention is a process of making a coated tool comprising the steps of: providing a substrate having a first surface and a second surface, the first surface and the second surface intersect to form an edge; applying an innermost layer containing titanium on the surface of the substrate; and applying a wear coating scheme on the innermost layer wherein the wear coating scheme includes one or more wear coating sequences with each wear coating sequence comprising an inner layer including aluminum and nitrogen and an outer layer including boron and nitrogen on the inner layer.

BRIEF DESCRIPTION OF THE DRAWINGS

These and other features, aspects and advantages of the present invention will be better understood with reference to the following description, appended claims, and accompanying drawings wherein:

DETAILED DESCRIPTION OF THE INVENTION

Figure 1:
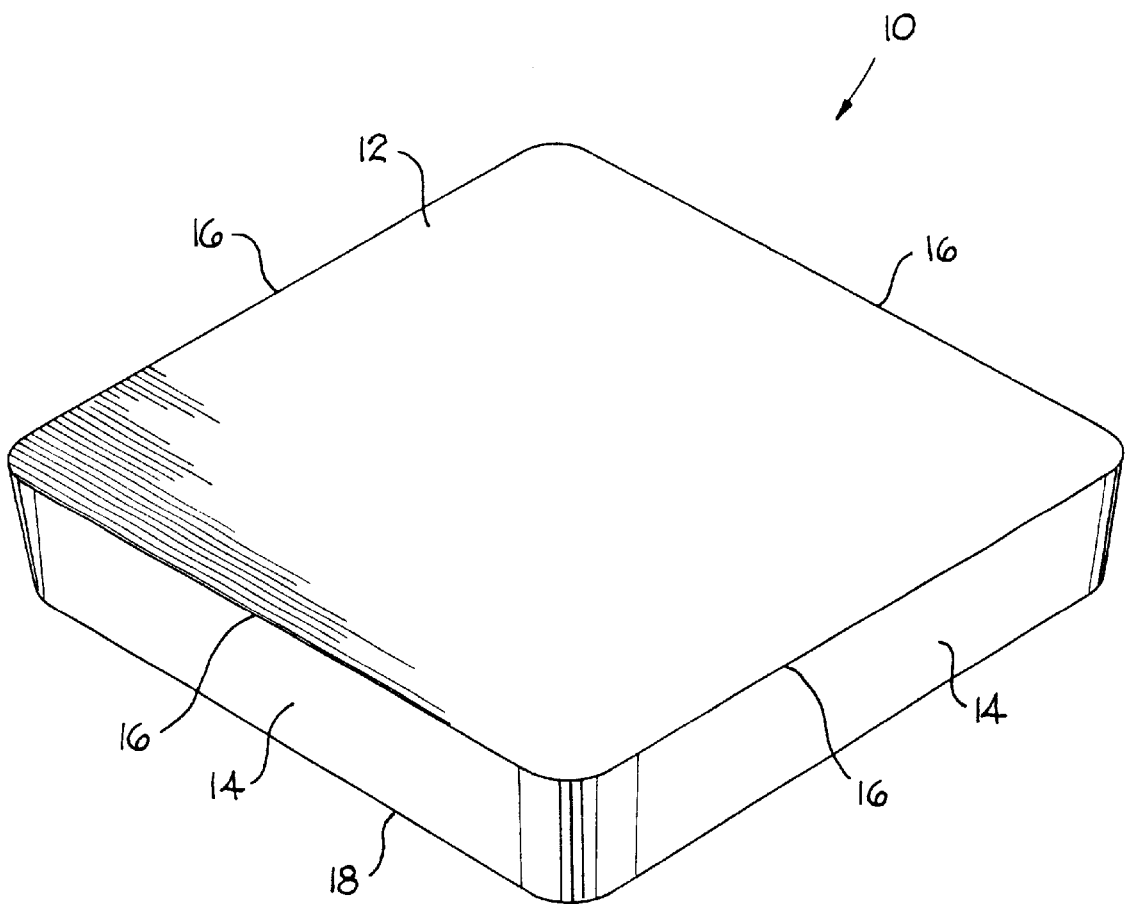
FIG. 1 is an isometric view of a specific embodiment of a cutting insert of the invention.

Referring to the drawings, FIG. 1 depicts a specific embodiment of a cutting insert, generally designated as 10. Cutting insert 10 presents a first surface (e.g., a rake face 12) and a second surface (e.g., a flank face 14). The rake face 12 and the flank face 14 intersect to form a cutting edge 16. The cutting insert 10 further includes a bottom surface 18.

Figure 2:
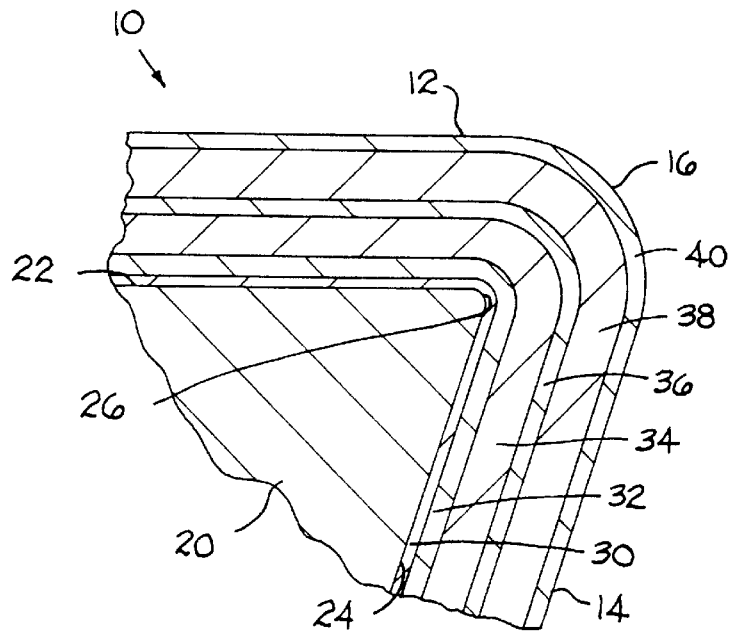
FIG. 2 is a cross-sectional view of a corner of the cutting insert depicted in FIG. 1 illustrating the coating scheme thereof.

Referring to FIG. 2, cutting insert 10 includes a substrate 20. Substrate 20 has a first surface (e.g., a rake surface 22) and a second surface (e.g., a flank surface 24). The rake surface 22 intersects the flank surface 24 to form a substrate cutting edge 26.

A thin layer 30 of a titanium-containing compound is directly on the surface of the substrate 20. A preferred example of a titanium-containing compound is titanium metal alone. However, it should be appreciated that applicant does not intend to restrict the scope of the thin layer 30 to comprise titanium metal alone, but such thin layer 30 may comprise other titanium-containing compounds such as, for example, titanium nitride, titanium carbide, or titanium carbonitride.

A layer 32 of a compound containing boron, carbon and nitrogen, i.e., a B—C—N compound, is on the surface of the thin titanium-containing layer 30. A preferred example of such a B—C—N compound is boron carbonitride; however, applicant does not intend to restrict the scope of the layer 32 to comprise only boron carbonitride, but such layer 32 may comprise any compound that includes boron, carbon and nitrogen.

A thicker layer 34 of a compound containing boron and nitrogen, i.e., a B—N compound, is on the surface of the B—C—N compound layer 32. An example of a compound containing boron and nitrogen is boron nitride which includes amorphous boron nitride and/or hexagonal boron nitride as well as at least a portion of cubic boron nitride. It should be appreciated that applicant does not intend to limit the scope of the thicker layer 34 to only boron nitride, but the thicker layer 34 may comprise any compound that contains boron and nitrogen.

The combination of the Ti-containing layer 30, the B—C—N compound layer 32 and the B—N compound layer 34 forms an adhesion coating scheme. It should be appreciated that applicant does not intend for layer 30, layer 32 or layer 34 to wholly comprise the same compound. In other words, layer 30 is not similar in composition to layer 32 or layer 34, and layer 32 is not similar in composition to layer 34.

It should be appreciated that the boundary between adjacent layers is generally not distinct. More specifically, there generally is some degree of intermixing of the compounds (or components) of the layers at the interface between adjacent layers. This intermixing is due to ion bombardment so as to form what may be called an intermixed layer at this interface.

This intermixed layer generally presents a concentration gradient of the elements wherein the composition is a mixture of the elements of the adjacent layers with the composition at any one location being more heavily weighted toward the closest layer. What this means for the above-described adhesion coating scheme, assuming that the layers (30, 32, and 34) comprise the preferred compounds, is that there is an intermixed layer (not illustrated) between the thin layer 30 of titanium and the adjacent layer 32 of boron carbonitride. This intermixed layer has a higher concentration of titanium the closer it is to the titanium layer and a higher concentration of boron and carbon and nitrogen the closer it is to the boron carbonitride layer.

There is an intermixed layer (not illustrated) between the layer 32 of boron carbonitride and the adjacent layer 34 of boron nitride. This intermixed layer has a higher concentration of carbon the closer it is to the layer 32 of boron carbonitride. The concentration of boron and nitrogen remains substantially constant throughout this intermixed layer since both the layer 32 (of boron carbonitride) and the layer 34 (of boron nitride) contain boron and nitrogen.

A wear coating scheme is on the surface of the outermost layer of the adhesion coating scheme. In this specific embodiment, the outermost layer of the adhesion coating scheme comprises the B—N compound layer 34.

In regard to the wear coating scheme, a thin layer 36 of a compound containing aluminum and nitrogen, i.e., an Al—N compound, is on the surface of the B—N compound outermost layer 34. One preferred example of the thin layer 36 is aluminum nitride; however, it should be appreciated that other compounds containing aluminum and nitrogen are contemplated to be within the scope of thin layer 36. Generally there is an intermixed layer (not illustrated) between the outermost layer 34 of the adhesion coating scheme and the thin layer 36. Assuming that layers 34 and 36 comprise the preferred compositions, the intermixed layer comprises boron and aluminum and nitrogen wherein the concentration of boron decreases (and the concentration of aluminum increases) as the intermixed layer moves away from the boron nitride layer to the aluminum nitride layer. The nitrogen concentration remains substantially constant throughout this intermixed layer since both layer 34 and layer 36 contain nitrogen.

A thicker layer 38 of a compound containing boron and nitrogen, i.e., a B—N compound, is on the surface of the Al—N compound layer 36. One preferred example of the thicker layer 38 comprises boron nitride, which includes amorphous boron nitride and/or hexagonal boron nitride and cubic boron nitride. However, applicant does not intend to restrict the scope of the thicker layer 38 only boron nitride, but such a layer may comprise other compounds containing boron and nitrogen. There is an intermixed layer (not illustrated) between the thin layer 36 and the layer 38. Assuming that layers 36 and 38 comprise the preferred compositions, the intermixed layer comprises boron and aluminum and nitrogen wherein the concentration of boron decreases (and the concentration of aluminum increases) as this intermixed layer moves away from the boron nitride layer to the aluminum nitride layer. The concentration of nitrogen remains substantially constant throughout this intermixed layer since layer 36 and layer 38 each contain nitrogen.

The combination of the Al—N compound layer 36 and the B—N compound layer 38 comprises a repeatable sequence of the wear coating scheme.

Although not mandatory for all cutting inserts, cutting insert 10 includes as a part of the wear coating scheme an outermost layer 40 of a compound containing titanium and nitrogen, i.e., a Ti—N compound. In the alternative, the outermost layer 40 may comprise a compound containing titanium and aluminum and nitrogen, i.e., a Ti—Al—N compound. One preferred example of the Ti—N compound is titanium nitride. One preferred example of the Ti—Al—N compound is titanium aluminum nitride.

There is an intermixed layer (not illustrated) between the layer 40 and the layer 38. Assuming that layer 38 comprises boron nitride and that layer 40 comprises titanium nitride, the intermixed layer comprises boron and titanium and aluminum and nitrogen wherein the concentration of the boron increases (and the concentration of the titanium decreases) as the intermixed layer moves away from the titanium nitride layer to the boron nitride layer. The concentration of nitrogen remains substantially constant throughout the intermixed layer since layer 38 and layer 40 each contain nitrogen.

Figure 3:
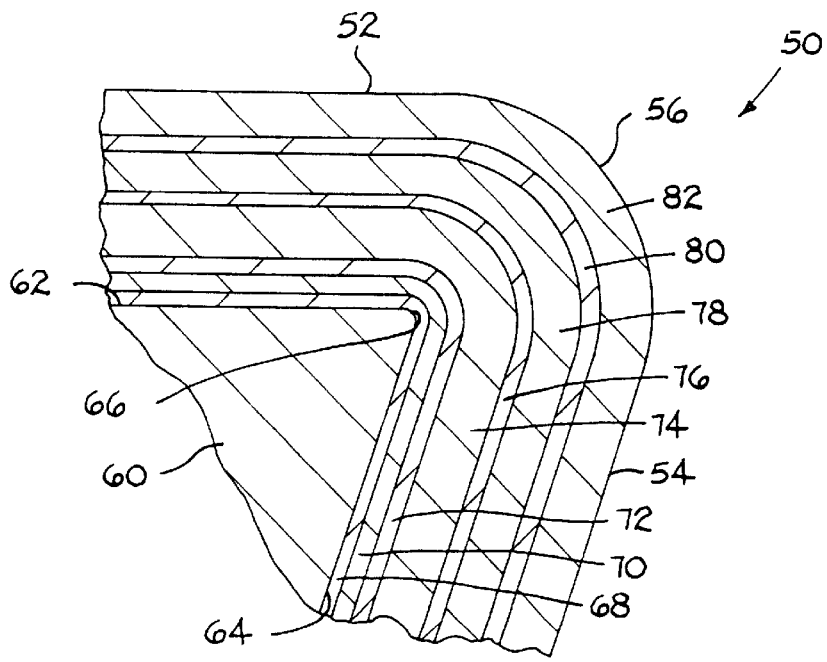
FIG. 3 is a cross-sectional view of a corner of a second specific cutting insert illustrating the coating scheme thereof.

Referring to FIG. 3, there is depicted a second specific embodiment of the cutting insert, generally designated as 50. Cutting insert 50 has a first surface (e.g., a rake face 52) and a second surface (e.g., a flank face 54) which intersect to form a cutting edge 56. Cutting insert 50 includes a substrate 60. The substrate 60 has a rake surface 62 and a flank surface 64 which intersect to form a substrate cutting edge 66. The cutting insert 50 also includes a coating scheme thereon. The coating scheme includes an adhesion coating scheme and a wear coating scheme.

The adhesion coating scheme includes a thin layer 68 including titanium, either alone or in a compound, on the surface of the substrate 60. Although not intended to be restrictive on the scope of thin layer 68, such a layer (68) may comprise titanium nitride, titanium carbide, or titanium carbonitride.

A layer 70 of a compound containing boron and carbon, i.e., a B—C compound, is on the surface of the titanium-containing layer 68. A preferred example of layer 70 comprises boron carbide. It should be appreciated that other compounds containing boron and carbon are contemplated to be within the scope of the layer 70.

A layer 72 of a compound containing boron, carbon and nitrogen, i.e., a B—C—N compound, is on the surface of the B—C compound layer 70. A preferred example of layer 72 comprises boron carbonitride. It should be appreciated that other compounds containing boron, carbon and nitrogen are contemplated to be within the scope of layer 72.

A layer 74 of a compound containing boron and nitrogen, i.e., a B—N compound, is on the B—C—N compound layer 72. A preferred example of layer 74 comprises boron nitride which includes amorphous boron nitride and/or hexagonal boron nitride and at least a portion of cubic boron nitride. It should be appreciated that other compounds containing boron and nitrogen are contemplated to be within the scope of layer 74.

It can thus be seen that the titanium-containing layer 68, the B—C compound layer 70, the B—C—N compound layer 72, and the B—N compound layer 76 comprise the adhesion coating scheme of cutting insert 50. Like for the embodiment of FIGS. 1 and 2, the boundaries between adjacent ones of the above layers are not distinct in that intermixed layers generally exist between these adjacent layers due to ion bombardment and the resultant intermixing of the elements. Thus, while these intermixed layers will not be described in detail, it should be appreciated that they generally exist and the above description of these layers with respect to the embodiment of FIGS. 1 and 2 provides guidance as to the nature of these intermixed layers for the embodiment of FIG. 3.

The wear coating scheme includes a thin layer 76 of a compound containing aluminum and nitrogen, i.e., an Al—N compound, on the surface of the B—N compound layer 76 (the outermost layer of the adhesion coating scheme). A preferred example of the thin layer 76 is aluminum nitride; however, other compounds containing aluminum and nitrogen are contemplated to be within the scope of the thin layer 76.

A layer 78 of a compound containing boron and nitrogen, i.e., a B—N compound, is on the surface of the Al—N compound layer 76. A preferred example of layer 78 comprises boron nitride which includes amorphous boron nitride and/or hexagonal boron nitride and at least a portion of cubic boron nitride. Other compounds containing boron and nitrogen are contemplated to be within the scope of layer 76.

A thin layer 80 of a compound containing aluminum and nitrogen, i.e., an Al—N compound, is on the surface of the B—N compound layer 78. A preferred compound for layer 80 comprises aluminum nitride. Other compounds containing aluminum and nitrogen are contemplated to be within the scope of the layer 80.

A layer 82 of a compound containing boron and nitrogen, i.e., a B—N compound, is on the surface of the Al—N compound layer 80. A preferred compound for layer 82 comprises boron nitride including amorphous boron nitride and/or hexagonal boron nitride and at least a portion of cubic boron nitride. Other compounds comprising boron and nitrogen are contemplated to be within the scope of the layer 82.

It can thus be seen that the Al—N compound layer 76, the B—N compound layer 78, the Al—N compound layer 80, and the B—N compound layer 82 comprise the wear coating scheme. In this regard, the combination of the Al—N compound layer (76 or 80) and its adjacent B—N compound layer (78 or 82) form a repeatable sequence. While the specific embodiment of FIG. 3 depicts two sequences of an Al—N compound/B—N compound, it should be appreciated that a tool (e.g., a cutting insert) may include a plurality of sequences.

Like for the embodiment of FIGS. 1 and 2, intermixed layers generally exist between adjacent layers due to ion bombardment and the resultant intermixing of the elements. Thus, while these intermixed layers will not be described in detail, it should be appreciated that they generally exist and the above description of these layers with respect to the embodiment of FIGS. 1 and 2 provides guidance as to the nature of these intermixed layers for the embodiment of FIG. 3.

Figure 5:
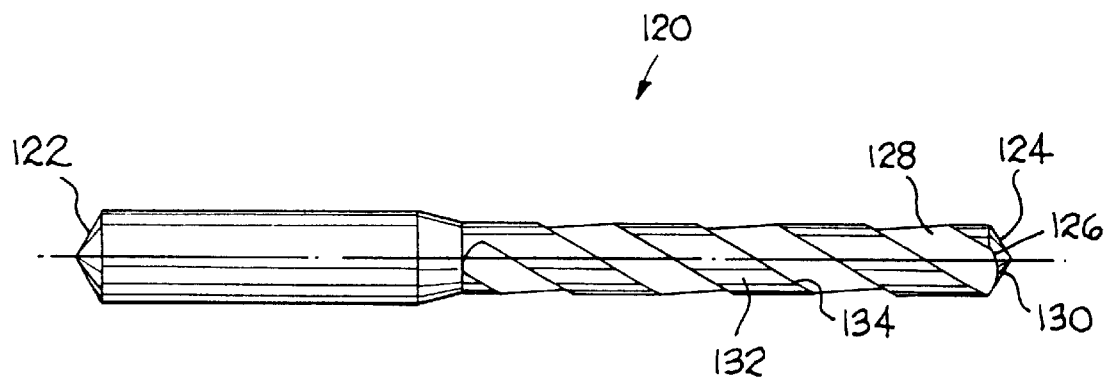
FIG. 5 is a side view of a specific embodiment of a drill (i.e., a round tool) of the invention.

Referring to FIG. 5, there is illustrated a drill generally designated as 120. Drill 120 has an axially rearward end 122 and an axially forward end 124. There is a forward surface 126 which intersects with a surface 128 defined by the flute to form a forward cutting edge 130. The surface 128 defined by the flute also intersects the cylindrical side surface 132 to form a side cutting edge 134. It can thus be appreciated that the drill presents one pair of surfaces (surface 126 and surface 128) which define one edge (edge 130), and another pair of surfaces (surface 128 and surface 132) which define another edge (edge 134). Although not shown, drill 120 has a multi-layer coating scheme of the invention deposited thereon.

The present invention is illustrated by the following examples of cutting inserts, which are provided to demonstrate and clarify various aspects of the present invention. The following should not be construed as limiting the scope of the claimed invention. In addition to cutting inserts, applicant contemplates that the invention applies to other tools which include without limitation round tools (e.g., drills, end mills, and reamers).

Referring now to the examples, an AIRCO TEMESCAL FC 1800 fast cycle electron beam (e-beam) evaporator unit with a water cooled (e.g., at a standard temperature of about 20° C.) high vacuum chamber equipped with a four-pocket Super Source e-beam gun was used to coat the substrates. The unit also included a residual gas analyzer (IQ 200 from Inficon), a quartz lamp for chamber heating, an ion source (Mark I gridless end-Hall type from Commonwealth Scientific Corp., Alexandria, Va.), an evaporation rate sensor (or monitor) (interfaced to an IQ 6000 controller from Inficon), and hot filaments(i.e., electrically resistively heated filaments) or an additional quartz lamp for supplemental substrate heating.

Figure 4:
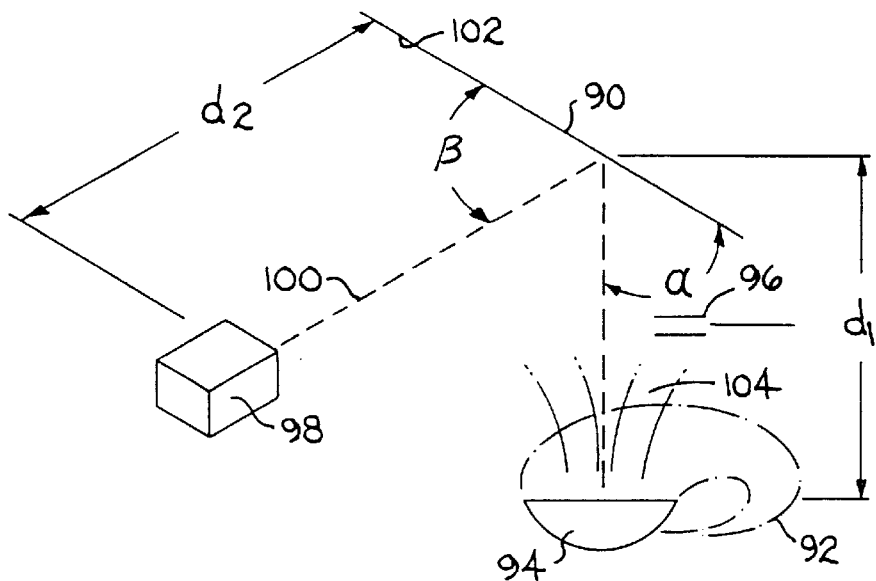
FIG. 4 depicts in schematic an arrangement of a substrate, an electron beam vapor source, and an ion source.

FIG. 4 depicts a substrate holder 90, an evaporant compound 94, an electron beam 92 for creating a vapor 104 from the evaporant compound 94, an evaporation rate sensor 96 (located on the periphery of the vapor 104 about 254 millimeters (10 inches) above the plane of the surface of the evaporant compound 94 and about 165 millimeters (6.5 inches) from the center of the evaporant compound 94 for measuring the evaporation rate of the evaporant compound 94, and an ion source 98. Angle α was measured between the plane of the substrate holder 90 and a line perpendicular to the surface of the evaporant compound 94 and substantially parallel to the line of sight from the evaporant compound 94. Angle β was measured between the plane of the substrate holder and the line of sight of the ion source.

The compounds used as the evaporant compound 94 included titanium, boron carbide, boron, and aluminum. The titanium and boron carbide each comprised 99.9 weight percent (wt%) commercially available compounds, while the boron comprised 99.5 wt % commercially available material. The aluminum comprised a high purity grade of commercially available aluminum.

Each run comprised the deposition of a coating scheme on a number of different SNMA432 style cutting insert substrates. These substrates included: (1) a silicon nitride based material having a coating of alumina on the surface of the substrate and a coating of titanium nitride on the alumina coating wherein the substrate comprises about 98.0 weight percent silicon nitride, about 1.0 weight percent magnesia, and about 1.0 weight percent yttria; (2) a silicon nitride based material which comprises about 98.0 weight percent silicon nitride, about 1.0 weight percent magnesia, and about 1.0 weight percent yttria; (3) a P-type doped silicon wafer; (4) a cemented tungsten carbide material comprising about 6.0 weight percent cobalt, about 0.5 weight percent chromium carbide, and the balance tungsten carbide wherein the material has a hardness of 93.0 Rockwell A;, and (5) a cemented tungsten carbide material comprising about 6.0 weight percent cobalt, about 2.0 weight percent tantalum niobium carbide, and the balance tungsten carbide wherein the material has a hardness of 92.7 Rockwell A.

Tables I through VIII set forth the parameters for the deposition of the coating layers. The row identified as "Description of the Composition of the Layer & Thickness" sets forth the composition of the layer and the thickness in Kiloangstroms (KÅ) of the coating layer. Referring to the description of the layers found in Tables I through VIII, the use of the expression "containing titanium" means that the layer contains titanium and is predominantly titanium metal. The use of the expression "containing boron and carbon" means that the layer contains boron and carbon and is predominantly boron carbide. The use of the expression "containing boron, carbon and nitrogen" means that the layer contains boron, carbon and nitrogen and is predominantly boron carbonitride. The use of the expression "containing boron and nitrogen" means that the layer contains boron and nitrogen and is predominantly boron nitride including amorphous boron nitride and/or hexagonal boron nitride and cubic boron nitride. The use of the expression "containing aluminum and nitrogen" means that the layer contains aluminum and nitrogen and is predominantly aluminum nitride.

The electron beam setting is set forth in a percentage of the input power as supplied by the power supply (i.e., the CV14 e-beam power supply). The chamber pressure is presented in torr. The evaporation rate is presented in angstroms per second as measured on the evaporation rate monitor located (at a position about 254 millimeters away from the surface of the vaporizing source and about 165 millimeters away from the center of the vaporizing source). The substrate temperature is in degrees centigrade (° C.). The duration of the deposition is in minutes. The ion beam energy is in electron volts (eV). The nitrogen flow rate is standard cubic centimeters per minute (sccm).

Generally speaking, all of the Runs Nos. 1–8 started with the deposition of a thin (1.00 Kiloangstroms) layer of a titanium-containing compound that was predominantly titanium metal. Except for Runs Nos. 7 and 8, all of the runs (Runs Nos. 1–6) next included the deposition of a layer of a boron and carbon containing compound that was predominantly boron carbide on the surface of the titanium-containing layer.

Runs Nos. 1–6 next had a layer of a compound containing boron, carbon and nitrogen deposited on the surface of the boron carbide layer according to the parameters. This layer was predominantly boron carbonitride which was a result of the nitrification of boron carbide.

Runs Nos. 1–6 next had a layer of boron and nitrogen containing compound applied on the surface of the boron, carbon and nitrogen containing layer. The layer of boron and nitrogen was predominantly boron nitride and included amorphous boron nitride and/or hexagonal boron nitride and at least some portion of cubic boron nitride.

Runs Nos. 1–6 next had a layer of a compound containing aluminum and nitrogen deposited on the surface of the boron nitride layer. This layer was predominantly aluminum nitride.

Runs Nos. 1–6 next had a layer of compound containing boron and nitrogen applied on the surface of the aluminum nitride layer. This layer was predominantly boron nitride and included amorphous boron nitride and/or hexagonal boron nitride and at least some portion of cubic nitride.

Runs Nos. 2, 3 and 5 next had a layer of compound containing aluminum and nitrogen deposited on the surface of the boron nitride layer. This later was predominantly aluminum nitride.

Runs Nos. 3 and 5 next had a layer of compound containing boron and nitrogen applied on the surface of the aluminum nitride. This layer was predominantly boron nitride includes amorphous boron nitride and/or hexagonal boron nitride and at least some portion of cubic boron nitride.

Referring to the deposition parameters for Run No. 7, a layer of a boron, carbon and nitrogen containing compound, which was predominantly boron carbonitride, was deposited on the titanium-containing layer previously mentioned. A layer of compound containing boron and nitrogen, which was predominantly boron nitride (including amorphous boron nitride and/or hexagonal boron nitride and at least some portion of cubic boron nitride), was deposited on the layer which was predominantly boron carbonitride. A layer of compound containing aluminum and nitrogen, which was predominantly aluminum nitride, was deposited on the layer containing boron and nitrogen. A layer of compound containing boron and nitrogen, which was predominantly boron nitride (including amorphous boron nitride and/or hexagonal boron nitride and at least some portion of cubic boron nitride), was deposited on the layer which was predominantly aluminum nitride.

In reference to Run No. 8, three sequences of the predominantly aluminum nitride layer-predominantly boron nitride layer were applied to the initial layer which was predominantly titanium.

Runs Nos. 3 through 8 had an outermost layer comprising titanium and nitrogen, which was predominantly titanium nitride, applied to the surface of the outermost layer which was predominantly boron nitride.

Referring to the set up of the equipment as depicted in FIG. 4 for the runs, the operating parameters comprised the angle α being between about forty-five degrees and about seventy-five degrees, angle β being between about sixty-five degrees and about eighty degrees, the distance $d_1$ being equal to about 444 millimeters, and the distance $d_2$ being equal to between about 90 millimeters and about 165 millimeters.

TABLE I

Parameters for the Deposition of Coatings During Run No. 1

| Layer/Parameter | First | Second | Third | Fourth | Fifth | Sixth |
|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 5.00 | Containing aluminum and nitrogen 1.00 | Containing boron and nitrogen 5.00 |
| Electron Beam Setting (% of Power) | 12 | 11–12 | 11 | 11–12 | 15 | 11 |
| Chamber Pressure (torr) | $1.0 \times 10^{-5}$ | $3.9–4.8 \times 10^{-6}$ | $2.1 \times 10^{-4}$ | $3.5–6.0 \times 10^{-4}$ | $3.6 \times 10^{-4}$ | $3.4 \times 10^{-4}$ |
| Evaporation Rate (angstroms/second) | 4.8–5.3 | 1.6–2.1 | 1.3–2.2 | 1.6–2.4 | 1.5–1.6 | 1.4–2.0 |
| Substrate Temperature (° C.) | 364–457 | 373–466 | 377–450 | 376–464 | 369–475 | 380–469 |
| Duration of Deposition (minutes) | 4 | 18 | 18 | 37 | 14 | 43 |
| ion beam energy (eV) | N/A | N/A | Not Rec'd | 170.5 | Not Rec'd | 170 |
| nitrogen flow rate (sccm) | N/A | N/A | Not Rec'd | 9.7 | Not Rec'd | Not Rec'd |

TABLE II

Parameters for the Deposition of Coatings During Run No. 2

| Layer/Parameter | First | Second | Third | Fourth | Fifth | Sixth | Seventh | Eighth |
|---|---|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 10.00 | Containing aluminum and nitrogen 1.00 | Containing boron and nitrogen 10.00 | Containing aluminum and nitrogen 1.00 | Containing boron and nitrogen 9.450 |
| Electron Beam Setting (% of Power) | 11 | 11 | 11 | 9–11 | 13–14 | 9–10 | 14 | |
| Chamber Pressure (torr) | $8 \times 10^{-6}$ | $7.0–7.2 \times 10^{-6}$ | $1.8–2.2 \times 10^{-4}$ | $4.7–5.2 \times 10^{-4}$ | $3.5 \times 10^{-4}$ | $5.1–5.3 \times 10^{-4}$ | $3.0 \times 10^{-4}$ | |
| Evaporation Rate (angstroms/second) | 4.9–5.0 | 1.3–2.3 | 2.1–2.5 | 1.4–2.7 | 1.2–2.1 | 1.4–2.4 | 1.8–2.4 | |
| Substrate Temperature (° C.) | 359–466 | 364–463 | 371–452 | 380–450 | 368–450 | 374–450 | 369–460 | |
| Duration of Deposition (minutes) | 4 | 18 | 21 | 25 | 12 | 94 | 10 | |
| ion beam energy (eV) | N/A | N/A | 170.9 | 170.5 | 170 | 170 | 170 | |
| nitrogen flow rate (sccm) | N/A | N/A | 10 | 5.3 | Not Rec'd | Not Rec'd | Not Rec'd | |

TABLE III

Parameters for the Deposition of Coatings During Run No. 3

| Layer/Parameter | First | Second | Third | Fourth | Fifth | Sixth | Seventh | Eighth | Ninth |
|---|---|---|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 7.00 | Containing aluminum and nitrogen 1.00 | Containing boron and nitrogen 7.00 | Containing aluminum and nitrogen 1.00 | Containing boron and nitrogen 7.00 | Containing titanium and nitrogen 1.00 |
| Electron Beam Setting (% of Power) | 9 | 8 | 8 | 7–8 | 10 | 7 | 11 | 7 | 7 |
| Chamber Pressure (torr) | $5.3 \times 10^{-6}$ | $7.0–8.5 \times 10^{-6}$ | $1.6–2.0 \times 10^{-4}$ | $5.2–5.6 \times 10^{-4}$ | $3.3 \times 10^{-4}$ | $5.4 \times 10^{-4}$ | $3.3 \times 10^{-4}$ | $5.4 \times 10^{-4}$ | $2.8 \times 10^{-4}$ |
| Evaporation Rate (angstroms/second) | 5.1–5.2 | 1.5–2.4 | 1.3–2.0 | 1.6–2.4 | 2.0–2.2 | 1.9–2.1 | 2.0–2.2 | 1.6–2.2 | 5.0–5.1 |
| Substrate Temperature (° C.) | 361–499 | 356–499 | 366–496 | 374–482 | 374–500 | Not Rec'd | 377–500 | 376–487 | 381–501 |

TABLE III-continued

Parameters for the Deposition of Coatings During Run No. 3

| Layer/Parameter | First | Second | Third | Fourth | Fifth | Sixth | Seventh | Eighth | Ninth |
|---|---|---|---|---|---|---|---|---|---|
| Duration of Deposition (minutes) | 4 | 21 | 20 | 125 | 10 | 57 | 10 | 56 | 5 |
| ion beam energy (eV) | N/A | N/A | 170.5 | 170.2 | 170.9 | 170.2 | 170.5 | 170 | 170.5 |
| nitrogen flow rate (sccm) | N/A | N/A | 10.0 | 9.5 | 8.7 | 6.3 | 8.6 | 6.2 | 9.4 |

TABLE IV

Parameters for the Deposition of Coatings During Run No. 4

| Layer/Parameter | First | Second | Third | Fourth | Fifth | Sixth | Seventh |
|---|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 10.00 | Containing aluminum and nitrogen 1.00 | Containing boron and nitrogen | Containing titanium and nitrogen |
| Electron Beam Setting (% of Power) | 9 | 8 | 8 | 7–8 | 11 | 7 | 7 |
| Chamber Pressure (torr) | $4.6 \times 10^{-6}$ | $3.3$–$3.5 \times 10^{-6}$ | $1.7$–$2.0 \times 10^{-4}$ | $5.2$–$5.5 \times 10^{-4}$ | $3.2 \times 10^{-4}$ | $5.2 \times 10^{-4}$ | Not Rec'd |
| Evaporation Rate (angstroms/second) | 5.0–5.2 | 1.4–2.2 | 1.5–2.4 | 1.7–2.7 | 1.8–2.2 | 1.9–2.0 | Not Rec'd |
| Substrate Temperature (° C.) | 364–475 | 364–470 | 370–462 | 343–400 | 347–408 | 338–400 | Not Rec'd |
| Duration of Deposition (minutes) | 5 | 20 | 22 | 82 | 10 | 9 | 5 |
| ion beam energy (eV) | N/A | N/A | 170.5 | 170.2 | 170 | Not Rec'd | 150 |
| nitrogen flow rate (sccm) | N/A | N/A | 10.0 | 8.1 | Not Rec'd | Not Rec'd | Not Rec'd |

TABLE V

Parameters for the Deposition of Coatings During Run No. 5

| Layer/Parameter | First | Second | Third | Fourth | Fifth | Sixth | Seventh | Eighth | Ninth |
|---|---|---|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 10.00 | Containing aluminum and nitrogen 1.00 | Containing boron and nitrogen 10.00 | Containing aluminum and nitrogen 1.00 | Containing boron and nitrogen 10.00 | Containing titanium and nitrogen 1.00 |
| Electron Beam Setting (% of Power) | 10 | 9 | 9 | 8 | 11 | 7 | 11 | 7–8 | 7 |
| Chamber Pressure (torr) | $5.7 \times 10^{-6}$ | $6.0$–$7.5 \times 10^{-6}$ | $1.7$–$1.9 \times 10^{-4}$ | $5.0$–$5.8 \times 10^{-4}$ | $3.3 \times 10^{-4}$ | $5.1$–$5.2 \times 10^{-4}$ | $3.2 \times 10^{-4}$ | $5.1 \times 10^{-4}$ | $2.8 \times 10^{-4}$ |
| Evaporation Rate (angstroms/second) | 5.1–5.2 | 1.3–2.0 | 1.5–2.5 | 1.5–2.4 | 2.0–2.2 | 1.5–2.4 | 2.1–2.2 | 1.3–2.4 | 4.8–5.1 |
| Substrate Temperature (° C.) | 369–499 | 373–503 | 382–516 | 379–450 | 374–458 | 376–450 | 374–454 | 377–450 | 381–452 |
| Duration of Deposition (minutes) | 3 | 21 | 19 | 82 | 11 | 180 | 8 | 84 | 4 |
| ion beam energy (eV) | N/A | N/A | 170.5 | 170.4 | 170 | 170 | 170 | 170.4 | 150.3 |
| nitrogen flow rate (sccm) | N/A | N/A | 10.0 | 8.2 | 8.5 | 6.2 | Not Rec'd | 6.1 | 9.4 |

TABLE VI

Parameters for the Deposition of Coatings During Run No. 6

| Layer/Parameter | First | Second | Third | Fourth | Fifth | Sixth | Seventh |
|---|---|---|---|---|---|---|---|
| Description of the Composition of the Layer & Thickness (KÅ) | Containing titanium 1.00 | Containing boron and carbon 2.00 | Containing boron, carbon, and nitrogen 2.00 | Containing boron and nitrogen 10.00 | Containing aluminum and nitrogen 1.00 | Containing boron and nitrogen 10.00 | Containing titanium and nitrogen 1.00 |
| Electron Beam Setting (% of Power) | 8 | 8 | 8 | 7 | 11 | 7 | 7 |
| Chamber Pressure (torr) | $7.5 \times 10^{-6}$ | $1.2 \times 10^{-5}$ | $1.1$–$1.6 \times 10^{-4}$ | $5.0$–$5.2 \times 10^{-4}$ | $5.0 \times 10^{-4}$ | $4.9$–$5.1 \times 10^{-4}$ | $2.8 \times 10^{-4}$ |
| Evaporation Rate (angstroms/second) | 4.0–5.1 | 1.8–2.4 | .5–4.8 | 1.5–2.6 | 1.8–2.4 | 1.0–4.2 | 4.5–5.6 |
| Substrate Temperature (° C.) | 365–491 | 368–492 | 379–487 | Not Rec'd | 373–495 | Not Rec'd | 400–556 |
| Duration of Deposition (minutes) | 4 | 14 | 12 | 85 | 12 | 66 | 3 |
| ion beam energy (eV) | N/A | N/A | 170.3 | 170.1 | 170 | 170.2 | Not Rec'd |
| nitrogen flow rate (sccm) | N/A | N/A | 10.1 | 6.3 | Not Rec'd | 6.2 | Not Rec'd |

TABLE VII

Parameters for the Deposition of Coatings During Run No. 7

| Layer/Parameter | First | Second | Third | Fourth | Fifth | Sixth |
|---|---|---|---|---|---|---|
| Description of the Composition of the Layer & Thickness (KÅ) | Containing titanium 1.00 | Containing boron, carbon, and nitrogen 2.00 | Containing boron and nitrogen 2.00 | Containing aluminum and nitrogen 1.00 | Containing boron and nitrogen 10.00 | Containing titanium and nitrogen 1.00 |
| Electron Beam Setting (% of Power) | 10 | 8–9 | 7–8 | 11 | 7 | 7 |
| Chamber Pressure (torr) | $3.6 \times 10^{-6}$ | $1.7$–$2.5 \times 10^{-4}$ | $5.0$–$5.2 \times 10^{-4}$ | $2.9 \times 10{-4}$ | $4.8$–$4.9 \times 10^{-4}$ | $2.5 \times 10^{-4}$ |
| Evaporation Rate (angstroms/second) | 5.1–5.3 | 1.6–2.4 | 1.8–2.3 | 1.8–2.3 | 1.8–2.3 | 5.0–5.2 |
| Substrate Temperature (° C.) | 370–513 | 384–499 | 379–480 | 378–501 | 378–478 | 384–495 |
| Duration of Deposition (minutes) | 4 | 18 | 82 | 4 | 80 | 9 |
| ion beam energy (eV) | N/A | N/A | 170.0 | 170 | 170.1 | 170 |
| nitrogen flow rate (sccm) | N/A | N/A | 6.2 | 8.7 | 6.1 | Not Rec'd |

TABLE VIII

Parameters for the Deposition of Coatings During Run No. 8

| Layer/Parameter | First | Second | Third | Fourth | Fifth | Sixth | Seventh | Eighth |
|---|---|---|---|---|---|---|---|---|
| Description of the Composition of the Layer & Thickness (KÅ) | Containing titanium 1.00 | Containing aluminum and nitrogen 1.00 | Containing boron and nitrogen 10.00 | Containing aluminum and nitrogen 1.00 | Containing boron and nitrogen 10.00 | Containing aluminum and nitrogen 1.00 | Containing boron and nitrogen 10.00 | Containing titanium and nitrogen 1.00 |
| Electron Beam Setting (% of Power) | 10 | 10 | 7–8 | 11–12 | 7 | 10 | 7 | 7 |
| Chamber Pressure (torr) | $3.2 \times 10^{-6}$ | $4.6 \times 10^{-4}$ | $4.4$–$4.5 \times 10^{-4}$ | $4.4$–$4.5 \times 10^{-4}$ | $4.3$–$4.4 \times 10^{-4}$ | $2.2 \times 10^{-4}$ | $4.6 \times 10^{-4}$ | $2.2 \times 10^{-4}$ |
| Evaporation Rate (angstroms/second) | 5.1–5.2 | 2.1 | 1.2–3.3 | 1.8–2.2 | 1.6–2.8 | 1.3–1.4 | 1.9–2.4 | 5.0–5.1 |
| Substrate Temperature (° C.) | 372–501 | 369–500 | 379–480 | 374–496 | 379–476 | 373–496 | 379–475 | 378–495 |
| Duration of Deposition (minutes) | 4 | 23 | 83 | 7 | 84 | 11 | 80 | 3 |
| ion beam energy (eV) | N/A | 170.3 | 170.4 | 170 | 170.6 | 170 | 170.6 | 170 |
| nitrogen flow rate (sccm) | N/A | 10 | 5.6 | Not Rec'd | 5.5 | Not Rec'd | 5.4 | Not Rec'd |

In regard to the coating scheme for each one of the runs, Table IX sets forth the coating layers and the thickness of each coating layer in Kiloangstroms (KA). In Table IX the designation "Ti" means that the layer contains titanium and is predominantly titanium metal; the designation "BC" means that the layer contains boron and carbon and is predominantly boron carbide; the designation "BCN" means that the layer contains boron, carbon and nitrogen and is predominantly boron carbonitride; the designation "BN" means that the layer contains boron and nitrogen and includes boron nitride including amorphous boron nitride and/or hexagonal boron nitride and at least a portion of cubic boron nitride; and the designation "TiN" means that the layer contains titanium and nitrogen and is predominantly titanium nitride.

TABLE IX

Coating Scheme (Compound and Thickness) for Runs Nos. 1 through 8

| Run No./Layer | Run No. 1 | Run No. 2 | Run No. 3 | Run No. 4 | Run No. 5 | Run No. 6 | Run No. 7 | Run No. 8 |
|---|---|---|---|---|---|---|---|---|
| 1st | Ti/1.00 | Ti/1.00 | Ti/1.00 | Ti/1.00 | Ti/1.00 | Ti/1.00 | Ti/1.00 | Ti/1.00 |
| 2nd | BC/2.00 | BC/2.00 | BC/2.00 | BC/2.00 | BC/2.00 | BC/2.00 | BC/2.00 | AlN/1.00 |
| 3rd | BCN/2.00 | BCN/2.00 | BCN/2.00 | BCN/2.00 | BCN/2.00 | BCN/2.00 | BN/2.00 | BN/10.00 |
| 4th | BN/5.00 | BN/10.00 | BN/7.00 | BN/10.00 | BN/10.00 | BN/10.00 | AlN/1.00 | AlN/1.00 |
| 5th | AlN/1.00 | AlN/1.00 | AlN/1.00 | AlN/1.00 | AlN/1.00 | AlN/1.00 | BN/10.00 | BN/10.00 |
| 6th | BN/5.00 | BN/10.00 | BN/7.00 | BN/ | BN/10.00 | BN/10.00 | TiN/1.00 | AlN/1.00 |
| 7th | — | AlN/1.00 | AlN/1.00 | TiN | AlN/1.00 | TiN/1.00 | — | BN/10.00 |
| 8th | — | BN/9.45 | BN/7.00 | — | BN/10.00 | — | — | TiN/1.00 |
| 9th | — | — | TiN/1.00 | — | TiN/1.00 | — | — | — |

In regard to the component layers of the adhesion coating scheme and the wear coating scheme of the Runs Nos. 1 through 8, for Run No. 1, the first through the fourth layers comprised the adhesion coating scheme while the fifth and sixth layers comprised the wear coating scheme. For Run No. 2, the first through he fourth layers comprised the adhesion coating scheme while the fifth through the eighth layers comprised the wear coating scheme.

For Run No. 3, the first through the fourth layers comprised the adhesion coating scheme while the fifth through the ninth layers comprised the wear coating scheme. In Run No. 3, the fifth and sixth layers and the same (or repeats of) the seventh and eighth layers.

For Run No. 4, the first through the fourth layers comprised the adhesion coating scheme while the fifth through the seventh layers comprised the wear coating scheme.

For Run No. 5, the first through the fourth layers comprised the adhesion coating scheme while the fifth through the ninth layers comprised the wear coating scheme. In Run No. 5, the fifth and sixth layers and the same (or repeats of) the seventh and eighth layers.

For Run No. 6, the first through the fourth layers comprised the adhesion coating scheme while the fifth through the seventh layers comprised the wear coating scheme.

For Run No. 7, the first through the third layers comprised the adhesion coating scheme while the fourth through the sixth layers comprised the wear coating scheme.

For Run No. 8, the first layer comprised the adhesion coating scheme while the second through the eighth layers comprised the wear coating scheme. The second and third layers are the same as the fourth and fifth layers and the sixth and seventh layers. In other words, the fourth and fifth layer is a repeat of the second and third layer, and the sixth and-seventh layer is a repeat of the second and third layer.

While the above examples were carried out under the conditions set forth above, it should be appreciated that the invention can be carried out under different conditions. For example, in the deposition of the layer comprising the compound containing boron and nitrogen, it would be expected that the use of a higher ion beam energy would result in a different (e.g., greater) amount of cubic boron nitride in the layer. One preferred way to increase the ion beam energy is to use multiple (e.g., two) ion beam guns wherein each ion beam gun may have a wide (e.g., higher) range of ion beam energies.

The patents and other documents identified herein are hereby incorporated by reference herein.

Other embodiments of the invention will be apparent to those skilled in the art from a consideration of the specification or practice of the invention disclosed herein. It is intended that the specification and specific runs be considered as illustrative only, with the true scope and spirit of the invention being indicated by the following claims.

What is claimed is:

1. A tool comprising:
   a substrate having a first surface and a second surface, the first surface and the second surface intersect to form an edge;
   an adhesion coating scheme on the substrate, the adhesion coating scheme comprising an innermost layer including titanium, the innermost layer being on the surface of the substrate, and an outermost adhesion layer;
   a wear coating scheme on the adhesion coating scheme, the wear coating scheme including one or more wear coating sequences wherein each wear coating sequence comprises an inner layer including aluminum and nitrogen and an outer layer including boron and nitrogen; and
   the adhesion coating scheme having a different composition than the wear coating scheme.

2. The tool of claim 1 wherein the adhesion coating scheme further includes a first intermediate layer on the innermost layer, the first intermediate layer including boron and carbon, the first intermediate layer being between the innermost adhesion layer and the outermost adhesion layer.

3. The tool of claim 2 wherein the first intermediate layer predominantly comprises boron carbide.

4. The tool of claim 2 wherein the first intermediate layer consists essentially of boron carbide.

5. The tool of claim 2 wherein the first intermediate layer includes boron and carbon and nitrogen.

6. The tool of claim 5 wherein the first intermediate layer predominantly comprises boron carbonitride.

7. The tool of claim 5 wherein the first intermediate layer consists essentially of boron carbonitride.

8. The tool of claim 2 wherein the outermost adhesion layer includes boron and nitrogen.

9. The tool of claim 8 wherein the outermost adhesion layer comprises boron nitride including one or both of amorphous boron nitride and hexagonal boron nitride; and the outermost adhesion layer further including cubic boron nitride.

10. The tool of claim 8 wherein the outermost adhesion layer consists essentially of boron nitride including one or both of amorphous boron nitride and hexagonal boron nitride; and the outermost adhesion layer further including cubic boron nitride.

11. The tool of claim 2 wherein the adhesion coating scheme further including a second intermediate layer on the first intermediate layer, the second intermediate layer including boron, carbon and nitrogen, the second intermediate layer being between the innermost adhesion layer and the outermost adhesion layer.

12. The tool of claim 11 wherein the second intermediate layer predominantly comprises boron carbonitride.

13. The tool of claim 11 wherein the second layer consists essentially of boron carbonitride.

14. The tool of claim 11 wherein the outermost adhesion layer predominantly comprises boron nitride including one or both of amorphous boron nitride and hexagonal boron nitride; and the outermost adhesion layer further including cubic boron nitride.

15. The tool of claim 11 wherein the outermost adhesion layer consisting essentially of boron nitride including one or more of amorphous boron nitride and hexagonal boron nitride; and the outermost adhesion layer further including cubic boron nitride.

16. The tool of claim 1 wherein the wear coating scheme further includes an exterior layer on the outer layer of the outermost wear coating sequence, and the exterior layer containing titanium.

17. The tool of claim 16 wherein the exterior layer comprises titanium aluminum nitride.

18. The tool of claim 1 wherein the inner layer of each wear coating sequence comprises a layer of aluminum nitride and the outer layer for each wear coating sequence comprises a layer of boron nitride including one or more of amorphous boron nitride and hexagonal boron nitride; and the layer of boron nitride further including cubic boron nitride; and for each wear coating sequence the layer of boron nitride has a thickness that is between about five times to about ten times greater than the thickness of the layer of aluminum nitride.

19. The tool of claim 1 wherein the tool includes a round tool.

20. The tool of claim 1 wherein the tool comprises a cutting insert wherein the first surface comprises a rake surface and the second surface comprises a flank surface so that the rake surface and the flank surface intersect to form a cutting edge.

21. A tool comprising:
a substrate having a first surface and a second surface, the first surface and the second surface intersect to form an edge;
an adhesion coating scheme on the substrate, the adhesion coating scheme comprising an innermost layer including titanium, the innermost layer being on the surface of the substrate, and an outermost adhesion layer;
a wear coating scheme on the adhesion coating scheme, the wear coating scheme including one or more wear coating sequences wherein each wear coating sequence comprises an inner layer including aluminum and nitrogen and an outer layer including boron and nitrogen wherein the outer layer is on the inner layer; and
the adhesion coating scheme having a different composition than the wear coating scheme.

22. The tool of claim 21 wherein the wear coating scheme further includes an exterior layer containing titanium, the exterior layer being on the outer layer of the outermost wear coating sequence.

23. The tool of claim 22 wherein the exterior coating is titanium nitride.

24. The tool of claim 21 wherein the inner layer of each coating sequence comprises a layer of aluminum nitride and the outer layer for each coating sequence comprises a layer of boron nitride including one or more of amorphous boron nitride and hexagonal boron nitride; and the layer of boron nitride further including cubic boron nitride; and the thickness of the outer layer of boron nitride is about ten times greater than the thickness of the inner layer of aluminum nitride.

* * * * *